US 10,878,862 B2

(12) United States Patent
Joo et al.

(10) Patent No.: US 10,878,862 B2
(45) Date of Patent: Dec. 29, 2020

(54) APPARATUSES AND METHODS FOR DRAM WORDLINE CONTROL WITH REVERSE TEMPERATURE COEFFICIENT DELAY

(71) Applicant: Micron Technology, Inc., Boise, ID (US)

(72) Inventors: Yangsung Joo, Boise, ID (US); Hidekazu Noguchi, Shinjuku-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/133,598

(22) Filed: Sep. 17, 2018

(65) Prior Publication Data

US 2020/0090713 A1 Mar. 19, 2020

(51) Int. Cl.
| | |
|---|---|
| G11C 7/04 | (2006.01) |
| G11C 7/22 | (2006.01) |
| G11C 7/12 | (2006.01) |
| G11C 11/4076 | (2006.01) |
| H03K 5/13 | (2014.01) |
| G11C 11/408 | (2006.01) |
| H03K 5/00 | (2006.01) |

(52) U.S. Cl.
CPC ............ *G11C 7/22* (2013.01); *G11C 7/04* (2013.01); *G11C 7/12* (2013.01); *G11C 11/4076* (2013.01); *G11C 11/4085* (2013.01); *H03K 5/13* (2013.01); *H03K 2005/00013* (2013.01)

(58) Field of Classification Search
CPC .................................. G11C 7/22; G11C 7/04
USPC ......................................................... 365/194
See application file for complete search history.

(56) References Cited

U.S. PATENT DOCUMENTS

| | | | | |
|---|---|---|---|---|
| 6,621,762 B1* | 9/2003 | Roohparvar | ............. | G11C 7/22 327/156 |
| 6,812,760 B1* | 11/2004 | Kim | ............. | H03L 7/0805 327/158 |
| 7,471,130 B2* | 12/2008 | Gomm | ............. | H03L 7/0812 327/158 |
| 7,557,631 B2* | 7/2009 | Sinha | ............. | G11C 7/04 327/261 |
| 2005/0135430 A1* | 6/2005 | Le | ............. | G11C 7/04 370/517 |
| 2005/0237848 A1* | 10/2005 | Takahashi | ............. | G11C 5/147 365/232 |

(Continued)

OTHER PUBLICATIONS

U.S. Appl. No. 16/472,773 titled "Methods and Apparatuses for Temperature Independent Delay Circuitry" filed Jun. 21, 2019.

*Primary Examiner* — Muna A Techane
(74) *Attorney, Agent, or Firm* — Dorsey & Whitney LLP

(57) ABSTRACT

Apparatuses and methods for a temperature dependent delay between a wordline off signal and deactivating the wordline are disclosed. Memory devices may have reduced reliability when operating at relatively cold temperatures, which may be due in part to an increase in the write recovery time while the timing for a wordline to deactivate remains relatively unaffected. In some embodiments of the present disclosure, a delay circuit is used to insert a temperature dependent delay between a wordline off command being issued and the wordline being deactivated. The delay circuit may increase the length of temperature dependent delay at relatively cold temperatures, and decrease the length of the delay at relatively warm temperatures.

13 Claims, 10 Drawing Sheets

(56) References Cited

U.S. PATENT DOCUMENTS

2012/0033503 A1* 2/2012 Kim .................. G11C 16/16
365/185.33

* cited by examiner

APPARATUSES AND METHODS FOR DRAM WORDLINE CONTROL WITH REVERSE TEMPERATURE COEFFICIENT DELAY

BACKGROUND

High data reliability, high speed of memory access, and reliable operation across a range of environmental conditions are all desirable in semiconductor memory devices. Memory devices, such as semi-conductor memory devices, may require precise timing for reliable operation. Signals may be transmitted between components of the memory device to direct operations such as pre-charge operations. The signals may have set timing from, for example generation of the signal to performance of an operation indicated by the signal. However, physical and/or environmental conditions of the memory device, e.g., the temperature of the memory device (and/or components of the memory device), may affect the timing of the signals.

FIGS. 1 and 2 are prior art graphs 100 and 200, respectively, of the timing of signals in a memory device in response to temperature. The graphs 100 and 200 represent examples of timing within a memory device which may be affected by temperature. The x-axis of the graphs represents the temperature of the memory device and is expressed in units of degrees Celsius (° C.). The y-axis of the graphs shows the timing of the signal and is expressed in units of nanoseconds (ns). Each graph 100, 200 shows the temperature characteristics of three different configurations of the memory device. The graphs 100 and 200 of FIGS. 1 and 2, respectively, may represent the operation of modeled circuits, rather than measured properties of an actual memory device. While FIGS. 1 and 2 show the particular operation of particular memory devices, it is to be understood that they are provided for illustrative purposes of the temperature response of prior art memory devices, and that other memory devices may have, for example, different timing, or different responses to temperature.

FIG. 1 shows a graph 100 representing the timing response with temperature of a write recovery time (tWR). The write recovery time tWR may specify the amount of delay between completion of a valid write operation and precharge of an active bank of the memory device. The tWR may be an indication of how long it takes data to be written to the memory device. As may be seen from the graph 100, between about 30° C. and 80° C., tWR is relatively stable with temperature. Below about 30° C., tWR increases dramatically as the temperature decreases.

FIG. 2 is a graph 200 representing the timing response with temperature of a row precharge time all banks (tRPAB). The row pre charge command timing tRPAB may specify a delay between a row precharge command being issued, and subsequent operations of the memory device. The tRPAB (or tRP if it is not measured for all banks) may be an indicator of how long it takes for all (or one) row of the memory device to be deactivated. As may be seen from the graph 200, below about 30° C., tRPAB is relatively constant with temperature. Above about 30° C., tRPAB increases with temperature.

The different temperature responses of different timings may lead to reduced reliability of the memory device at relatively low temperatures.

DETAILED DESCRIPTION OF THE EMBODIMENTS

Figure 1:
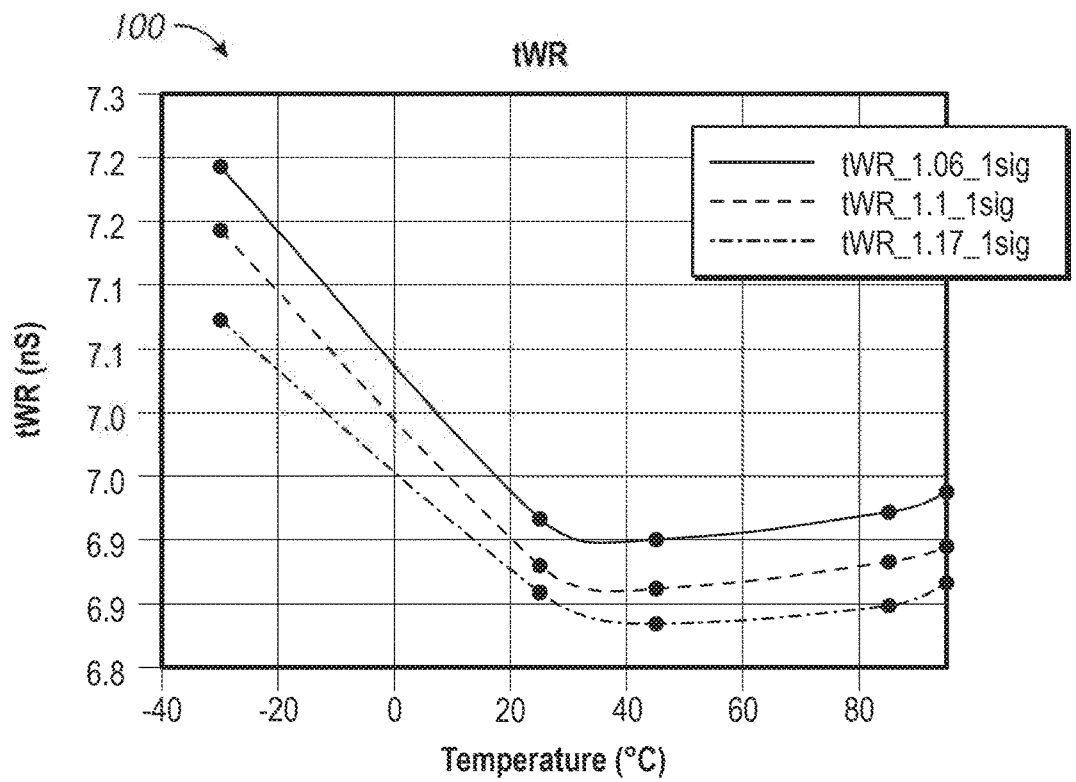
FIGS. 1 and 2 are prior art graphs of the timing of signals in a memory device in response to temperature.

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Semiconductor memory devices may be used to store information. A memory device may include a bank of memory cells which are coupled in an array by wordlines (rows) and bit lines (columns). A given wordline may be activated in order to access data in a memory cell, which is read off of the corresponding bit line. After the data is read off a memory cell, it may be written back to the memory cell, and then the row of memory may be closed by deactivating the wordline. The memory device may need to operate with strict timing requirements, so that, for example, data is not accidentally overwritten or otherwise destroyed in the memory device. As an example, the timing of certain operations may need to be within a known range, such that, for example, the time between a command being issued (e.g., a wordline off command) and the command being executed (e.g., the wordline being turned off) is under a timing requirement of the memory device. The timing requirements may ensure that commands are executed in a proper sequence so that, for example, the wordline is not turned off while data is still being written to the memory cells along the wordline. The speed at which commands are issued and carried out may be due, at least in part, to physical properties of the memory device, such as the time it takes a signal to propagate (a propagation delay) along conductive paths within the device. Accordingly, the timing may be affected by physical conditions which influence the physical properties of the memory device, such as temperature. The temperature may affect the timing of different elements at different rates, which may cause signals to operate out of a normal sequence under some temperature conditions. This may reduce the reliability of the memory device. Thus, it may be desirable to control the timing of signals with temperature to ensure that commands are executed in a proper sequence across a wide range of temperature conditions.

As a specific example of a command signal with temperature dependence, the timing of a wordline deactivation in a memory device will be discussed. After a write operation (either to write new data to a memory cell, or to write back data read from the memory cell) it may be necessary to deactivate the wordline and return the wordline to an idle state before subsequent operations can occur. The write recovery time (tWR) is the delay between a write operation and a precharge operation, which deactivates the wordline. The tWR may be a setting of the memory device, and may ensure that the write operations have finished before the row is deactivated with the precharge command. The row precharge delay (tRP) may be the length of time between a precharge command being issued and a subsequent row activation of the memory device. The tRP may also be a setting of the memory device, and may ensure that all rows are actually pre-charged (e.g., deactivated, closed) in response to an issued pre-charge command.

Figure 2:
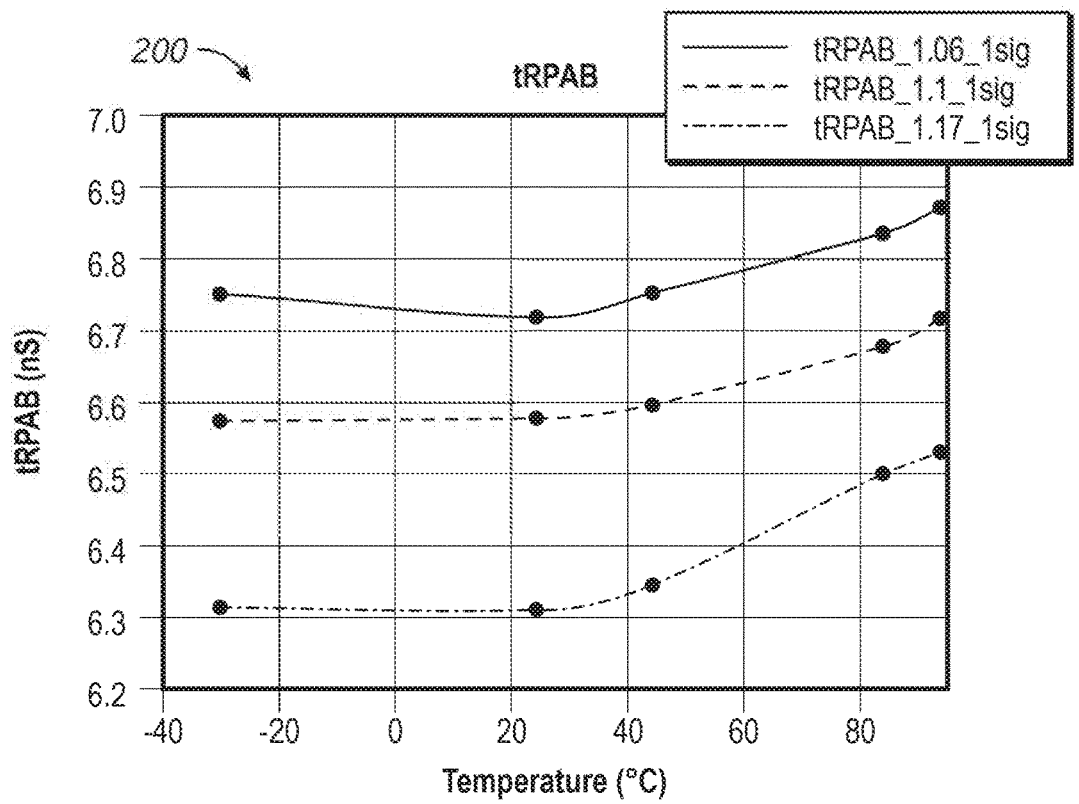

As described above with respect to FIGS. 1 and 2, tWR may increase as temperature decreases, while tRP may remain relatively constant as the temperature decreases. Thus, under certain temperature conditions, tWR may not have elapsed when the row is deactivated. This may reduce the reliability of the memory in cold conditions, as the command to precharge the memory may be executed before the write-back operation can finish.

Another potential problem for cold operation of semiconductor device is caused by hot-carrier degradation of transistors within the memory device. Transistors may degrade over time to hot carrier injection, where an electron or hole jumps across a barrier (e.g., into the gate) of the transistor. Transistors that have experienced hot carrier injection may undergo one or more changes to their operating characteristics (e.g., threshold voltage) known as hot carrier degradation. Certain types of hot carrier degradation may have more severe effects as the temperature decreases.

Accordingly, it may be desirable to mitigate the temperature dependent effects on semiconductor memory devices, especially at relatively cold temperatures. A semiconductor memory device according to an embodiment of the present disclosure may be configured such that the time between a pre-charge command being issued and the wordline being deactivated increases with decreasing temperature. This may ensure that tWR has a chance to elapse before the wordline is deactivated (pre-charged). In some embodiments a delay circuit may be added to a command path of a semiconductor memory device. The delay circuit may receive a command signal at a first time and then provide the command signal at a second time. The delay between the first time and the second time may be responsive to a determined temperature. In particular, the delay circuit may be configured such that the delay is inversely proportional to the temperature (e.g., has a reverse temperature coefficient), and accordingly the delay may increase based on a decrease in temperature and the delay may decrease based on an increase in temperature.

Figure 3:
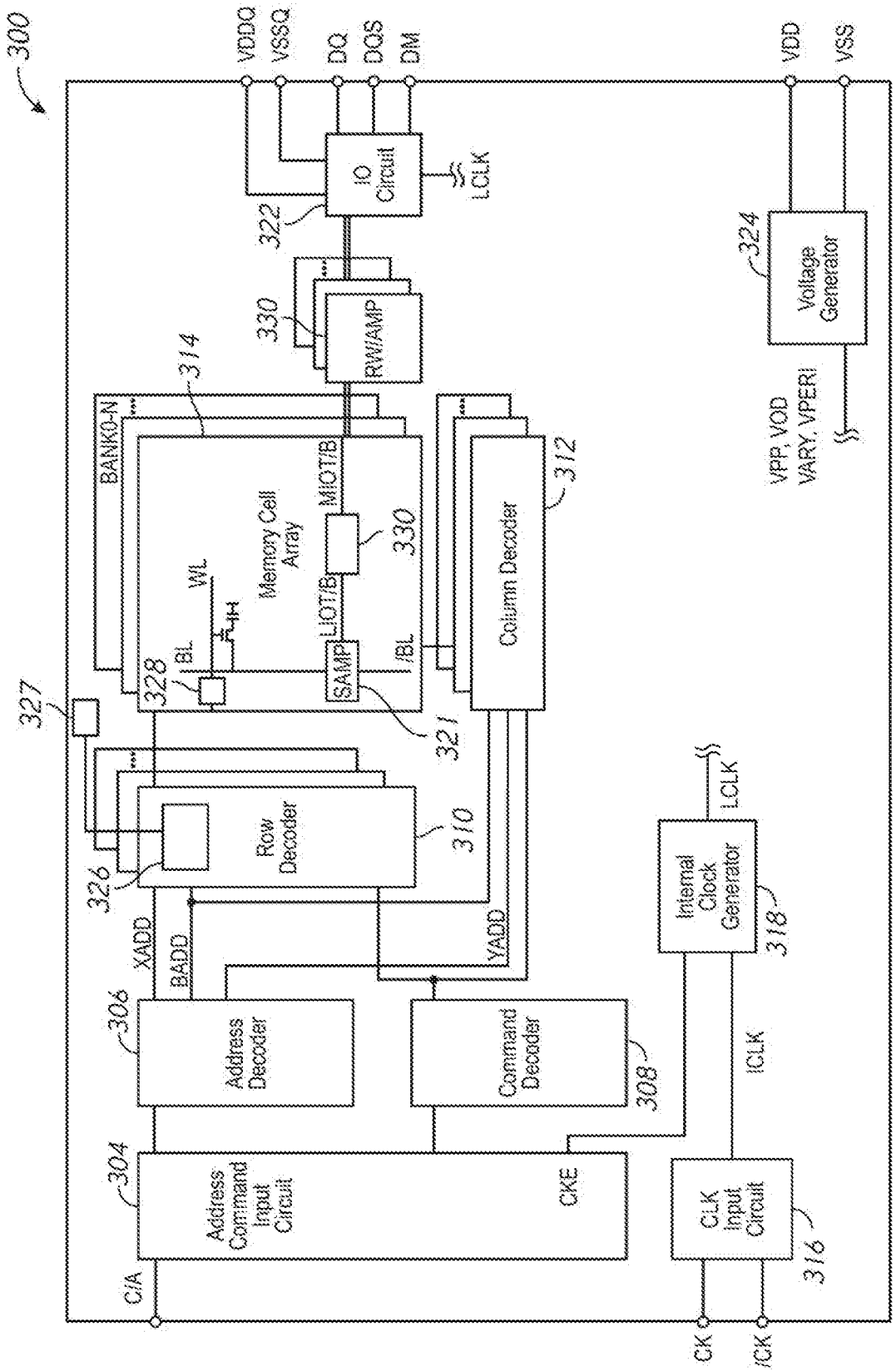
FIG. 3 is a schematic diagram of a semiconductor memory device in accordance with an embodiment of the disclosure.

FIG. 3 is a schematic block diagram of a semiconductor device, in accordance with an embodiment of the present disclosure. The semiconductor device 300 may include a clock input circuit 316, an address command input circuit 304, an internal clock generator 318, an address decoder 306, a command decoder 308, a plurality of row (e.g., first access line) decoders 310, a plurality of column (e.g., second access line) decoders 312, a delay circuit 326, a temperature sensor 327, a memory cell array 314 including wordline driver circuits 328, sense amplifiers 329 and transfer gates 330, a plurality of read/write amplifiers 320, an input/output (I/O) circuit 322, and a voltage generator circuit 324. The semiconductor device 300 may include a plurality of external terminals including address and command terminals C/A coupled to command/address circuit 304, clock terminals CK and/CK, data terminals DQ, DQS, and DM, and power supply terminals VDD, VSS, VDDQ, and VSSQ.

While a specific configuration of memory device 300 is shown, it is to be understood that variations may be made without departing from the scope of the disclosure. For example, the number and type of data terminals, clock terminals, and/or power supply terminals may all be varied. The terminals and signal lines associated with the command/address bus may include a first set of terminals and signal lines that are configured to receive the command signals and a separate, second set of terminals and signal lines that configured to receive the address signals, in some examples. In other examples, the terminals and signal lines associated with the command and address bus 106 may include common terminals and signal lines that are configured to receive both command signal and address signals. The semiconductor device may be mounted on a substrate, for example, a memory module substrate, a mother board or the like.

The semiconductor device 300 may be a semiconductor memory device, such as dynamic random-access memory (DRAM). The semiconductor device 300 may have a memory cell array 314 which may have a plurality of memory cells storing data. The memory cell array 314 includes a plurality of banks BANK0-N, where N is a positive integer, such as 3, 7, 15, 31, etc. Each bank BANK0-N may include a plurality of wordlines WL, a plurality of bit lines BL, and a plurality of memory cells MC arranged at intersections of the plurality of wordlines WL and the plurality of bit lines BL. The selection of the wordline WL for each bank BANK0-N is performed by a corresponding row decoder 310 and the selection of the bit line BL is performed by a corresponding column decoder 312.

The address/command input circuit 304 may receive an address signal and a bank address signal from outside at the command/address terminals via the command/address bus C/A and transmit the address signal and the bank address signal to the address decoder 306. The address decoder 306 may decode the address signal received from the address/command input terminals C/A and provide the bank address signal BADD, the row address signal XADD and the column address signal YADD to the row decoder 310.

The address/command input circuit 304 may receive a command signal at the command/address terminals via the command/address bus C/A. The command signal may be external, such as, for example, from a memory controller. The address/command input circuit 304 may provide the command signal to the command decoder 308. The command decoder 308 may decode the command signal and provide and/or generate various internal command signals. For example, the internal command signals may include a row command signal to select a wordline, a column command signal, such as a read command or a write command, to select a bit line. The command decoder 308 may provide one or more of these command signals (here shown as a single command signal CMD for clarity) to the row decoder 310 and/or column decoder 312.

The row decoder 310 and the column decoder 312 may receive command and address signals from the address decoder 306 and the command decoder 308 respectively and provide signals to one or more specified elements of the memory cell array 314. The row decoder 310 may receive a row address XADD and a bank address BADD from the address decoder 306, along with one or more command signals from the command decoder 308. In a similar manner, the column decoder 312 may receive the column address YADD and the bank address BADD from the address decoder 306 and one or more command signals from the command decoder 308. The row decoder 310 and/or column decoder 312 may then send one or more signals to appropriate components of the memory cell array 314 in order to carry out an operation.

In an example precharge operation, the row decoder 310 may provide a wordline off signal to a wordline WL specified by the row address XADD in a bank specified by the bank address BADD. In particular, the row decoder 310 may provide one or more signals to a wordline driver circuit 328 coupled to the specified wordline WL. In response to the precharge command, the wordline driver circuit 328 may change the voltage along the wordline WI, from a high voltage to a low voltage.

The memory device 300 may include a delay circuit 326 configured to add a temperature dependent delay to one or more signals. In some embodiments, the delay circuit 326 may add a temperature dependent delay between the precharge command being issued and the wordline driver circuit 328 changing the voltage of the wordline WL. In some embodiments, the delay circuit 326 may delay certain commands provided to the wordline driver circuit 328 relative to other commands provided to the wordline driver circuit 328. While the delay circuit 326 is shown as a component of the row decoder 310, in some embodiments, the delay circuit may be a separate component of the memory device 300 or may be a part of a different component, such as the command decoder 308 or memory cell array 314.

The delay circuit 326 may receive a signal at a first time, and provide it at a second time after the first time. The delay between the second and first time may be temperature dependent. In particular, the delay may be increased at a relatively low temperature, and decreased at a relatively high temperature. In some embodiments, the delay circuit may be coupled to an optional temperature sensor 327. Although the temperature sensor is shown positioned at the memory bank 314, the temperature sensor may be positioned at any location about the memory device 300. In some embodiments, the delay circuit 326 may be responsive to a temperature of the delay circuit 326, and the temperature sensor may be omitted from the memory device 300.

When a read command is issued and a row address and a column address are timely supplied with the read command, read data is read from a memory cell in the memory cell array 314 designated by the row address and the column address. The read/write amplifiers 320 may receive the read data and provide the read data to the IO circuit 322. The IO circuit 322 may provide the read data to a location outside the semiconductor device 300 via the data terminals DQ. Similarly, when the write command is issued and a row address and a column address are timely supplied with the write command, and then the input/output circuit 320 may receive write data at the data terminals DQ and provide the write data via the read/write amplifiers 320 to the memory cell array 314. Thus, the write data may be written in the memory cell designated by the row address and the column address.

Turning to the explanation of the external terminals included in the semiconductor device 300, the clock terminals CK and /CK may receive an external clock signal and a complementary external clock signal, respectively. The external clock signals (including complementary external clock signal) may be supplied to a clock input circuit 316. The clock input circuit 316 may receive the external clock signals and generate an internal clock signal ICLK. The clock input circuit 316 may provide the internal clock signal ICLK to an internal clock generator 318. The internal clock generator 318 may generate a phase controlled internal clock signal LCLK based on the received internal clock signal ICLK and a clock enable signal CKE from the address/command input circuit 304. Although not limited thereto, a DLL circuit may be used as the internal clock generator 318. The internal clock generator 318 may provide the phase controlled internal clock signal LCLK to the IO circuit 322.

The power supply terminals may receive power supply voltages such as Vdd and Vss from a system that the memory device 300 is coupled to. These power supply voltages may be supplied to a voltage generator circuit 324. The voltage generator circuit 324 may generate various internal voltages based on the power supply voltages and may provide the internal voltages and/or the power supply voltages Vdd and Vss to other components of the memory device 300. While a variety of different voltages may be used by different components of the memory device 300, for clarity Vdd will be used to represent a positive or 'high' voltage level, while Vss will be used to represent a ground or 'low' voltage level.

Figure 4:
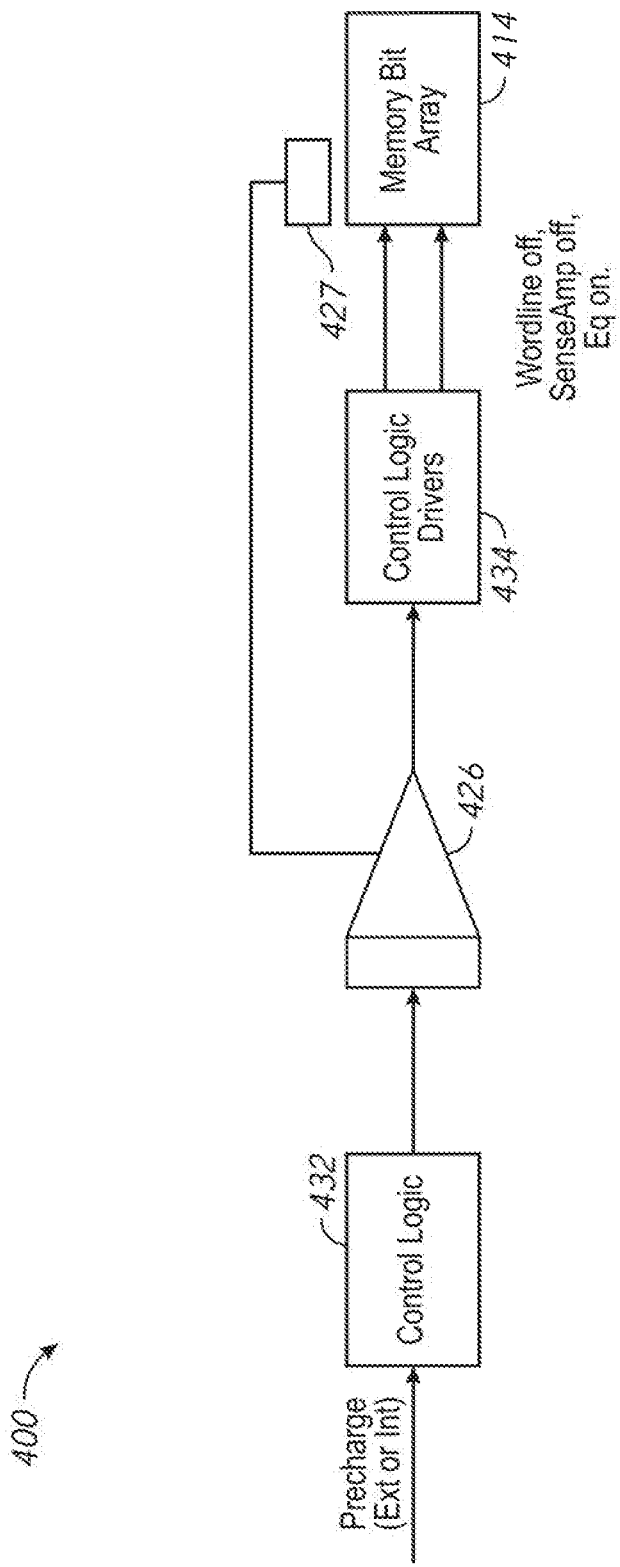
FIG. 4 is a block diagram of a signal path in a semiconductor memory device in accordance with an embodiment of the disclosure.

FIG. 4 is a block diagram of a signal path in a semiconductor memory device in accordance with an embodiment of the disclosure. FIG. 4 shows a signal path 400, which may represent a signal path in a semiconductor memory device, such as the semiconductor memory device 300 of FIG. 3, in some examples. The signal path 400 shows the path that a precharge command takes in a device until it arrives at a memory cell array 414 and is executed. The signal path 400 may include one or more components of the device that the signal has to pass through on its way to the memory cell array 414. The components may include control logic 432, delay circuit 426, control logic drivers 434, and the memory cell array 414. The delay circuit 426 may be coupled to a temperature sensor 427. Although shown here as a separate component, in some embodiments, the temperature sensor 427 may be integral with the delay circuit 426. In some embodiments, the temperature sensor 427 may be omitted.

The signal path 400 may receive a command signal and provide it to the memory cell array 414. The command signal may be generated external to the device (e.g., received at command/address bus C/A of FIG. 3) or may be generated by an internal component of the memory device (e.g., by command decoder 308 of FIG. 3). In some embodiments, the command signal may be a precharge command which may indicate a precharge operation of one or more wordlines in the memory cell array 414. The precharge command may be linked to one or more row addresses (not shown). The command signal may be provided to the signal path 400 at a first time t0, and may be executed by the memory cell array at a second time t1. The delay circuit 426 may selectively vary the time between t0 and t1 in response to a temperature of the system.

The control logic 432 may represent one or more components of the memory device which receive the command signal. In some embodiments, the control logic 432 may represent the address/command input circuit 304, address decoder 306, and/or command decoder 308 of FIG. 3. In some embodiments, the control logic 432 may also represent the row decoder 310. The control logic 432 receives the command signal and provides it to the delay circuit 426. The control logic 432 may perform one or more operations on the command signal (e.g., decoding it). The control logic 432 may add to the timing between t0 and t (e.g., with a propagation delay and/or the time it takes the control logic 432 to operate in response to the command signal). The timing of the control logic may be, at least in part, dependent on the temperature.

The delay circuit 426 may receive the command signal at a first time t2 and provide the command signal at a second time t3. The times t2 and t3 may be between the overall first and second times to, and t1 of the signal path 400. The delay circuit 426 may establish the delay between t2 and t3 in response to a temperature of the semiconductor device. The delay may be inversely proportional to the temperature such that the delay between t2 and t3 is longer in response to a relatively cold temperature, and shorter in response to a relatively high temperature.

In some embodiments, the delay circuit may be responsive to a measured temperature signal. The temperature signal may be provided by an optional temperature sensor 427. The temperature sensor 427 may be positioned near one or more components of the memory device. As shown, the temperature sensor is positioned near the memory cell array 414. In some embodiments, the temperature sensor may be integral with the delay circuit 426. In embodiments where the delay circuit is responsive to a temperature signal, the delay circuit 426 may include a programmable delay such as a digital programmable delay. An example delay circuit responsive to a measured temperature signal is described in FIG. 10.

In some embodiments, the relationship between the length of the delay and the temperature may be an inherent relationship based on one or more physical properties of the delay circuit. For example, the length of the delay may be responsive to a temperature of one or more components of the delay circuit 426. In some embodiments, the delay circuit may be an analogue circuit and the delay time of the delay circuit 426 may be based on the physical properties of the components of the delay circuit 426. An example analogue delay circuit is described in FIGS. 8-10. In some embodiments when the delay circuit 426 is responsive to an inherent relationship with the temperature, the temperature sensor 427 may not be needed, and may be omitted from the circuit path 400 (and from the semiconductor device 300 of FIG. 3).

Although the delay circuit 426 is shown inserted at a certain point along the signal path 400, it is to be understood that the delay circuit 426 may be inserted at any point along the path. In some embodiments, the delay circuit 426 may be integral to one of the components. In some embodiments the delay circuit 426 may be a separate circuit element.

The delay circuit 426 may provide the command signal to control logic drivers 434. The control logic drivers 434 may represent one or more components after the delay circuit but before the memory cell array 414 along the signal path 400. For example the control logic drivers 434 may include the row decoder 310 of FIG. 3. The control logic drivers 434 may receive the command signal and may generate one or more specific signals to execute the command signal. For example, as shown the command signal is a precharge signal, and the control logic drivers 434 provide a 'Wordline Off' signal, a 'SenseAmp Off' signal, and an 'Eq. On' signal to the memory array 414. More or less signals may be generated in other examples. In some examples, the control logic drivers 434 may be part of the memory bank 414. Similar to the control logic 42, the control logic drivers 434 may also have timing which may also be, at least in part, dependent on temperature.

One or more components of the memory array 414 may receive the signals from the control logic drivers 434 and execute a command indicated by the command signal. As an example, the memory array 414 may include a wordline driver (e.g., wordline driver 328 of FIG. 3) which may be responsive to the 'Wordline Off' signals generated in response to a precharge command. Although only a single memory bank of the memory array 414 is shown, there may be multiple banks arranged together into a memory cell array (e.g., memory cell array 314 of FIG. 3).

The timing between the command signal being provided to the control logic 432 at t0 and executed in the memory array 414 at t1 may thus be dependent on the timing of one or more components (e.g., the control logic 432, control logic drivers 434, and memory array 414) as well as the time between t2 and t3 added by the delay circuit 426. One or more of the control logic 432, control logic drivers 434, and/or memory cell array 414 may operate with a timing that increases with increasing temperature and decreases with decreasing temperature. The delay circuit 426 may have a delay which is inversely proportional to temperature, which may, at least in part, compensate for a temperature dependence of the other components in the circuit path 400. In some embodiments, the overall timing between t0 and t1 may decrease with decreasing temperature, even though the time between t2 and t3 may increase due to the operation of the delay circuit 426. Similarly, in some embodiments the overall timing between t0 and t1 may increase with increasing temperature, even though the time between t2 and t3 may decrease due to the operation of the delay circuit 426. Thus, the signal path 400 may have a ratio of the timing between the delay of the delay circuit 426 and the timing of the other components of the circuit path 400 which is altered by the temperature.

Figure 5:
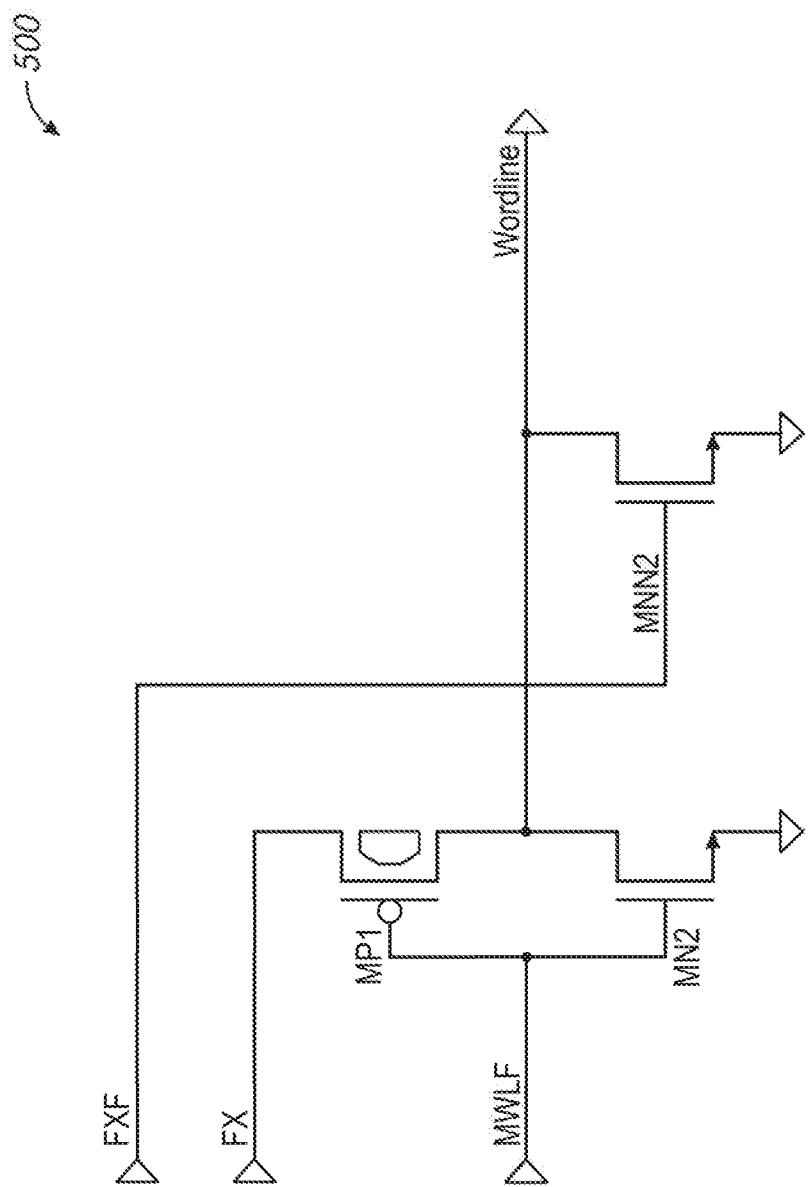
FIG. 5 is a schematic diagram of a wordline driver circuit operated by timing signals in accordance with embodiments of the disclosure.

FIG. 5 is a schematic diagram of a wordline driver circuit operated by timing signals in accordance with embodiments of the disclosure. The wordline driver circuit 500 may be the wordline driver 328 of FIG. 3 in some embodiments. A semiconductor device (e.g., the semiconductor device 300 of FIG. 3) may include a plurality of wordline driver circuits 500 each coupled to a respective wordline in each of the banks of the memory cell array. The wordline driver circuit 500 may include transistors such as transistors MP1, MN2, and MNN2. Transistor MP1 may be a PMOS type transistor, while transistors MN2 and MNN2 may be NMOS type transistors. The wordline driver circuit 500 may receive signals FXF, FX, and MWLF, which may be provided by, for example, the control logic drivers 434 of FIG. 4. Each of the signals may be digital signals that alternate between a logical high (e.g., 'on', a high voltage, Vdd) and a logical low (e.g., 'off', a low voltage, Vss, ground). The wordline driver circuit 500 may be coupled to a Wordline, and may selectively activate (e.g., increase to a logical high) or deactivate (e.g., decrease to a logical low) a voltage of the wordline.

The gates of the transistors MP1 and MN2 are coupled in common to the signal MWLF. A source of the transistor MP1 is coupled to the signal FX, and a drain of the transistor MP1 is coupled to the wordline. The drain of transistor MN2 is also coupled to the wordline, and the source of transistor MN2 is coupled to a ground voltage. The transistor MNN2 also has a drain coupled to the wordline and also has a source coupled to a ground voltage. The gate of transistor MNN2 is coupled to the signal FXF.

Accordingly, when the signal MWLF is at a logical high, the transistor MP1 is inactive while the transistor MN2 is active and couples the wordline to the ground voltage. When the signal MWLF is at a logical low, the transistor MN2 is inactive, and the signal FX is coupled to the wordline. When the signal FXF is at a logical high, the transistor MNN2 is active and the wordline is coupled to ground via the transistor MNN2. When the signal FXF is at a logical low, the transistor MNN2 is not active. As described in FIG. 6, the signals may operate together in order to reduce the stress on the transistors MN2 and MNN2 in order to reduce the effects of hot carrier degradation.

Figure 6:
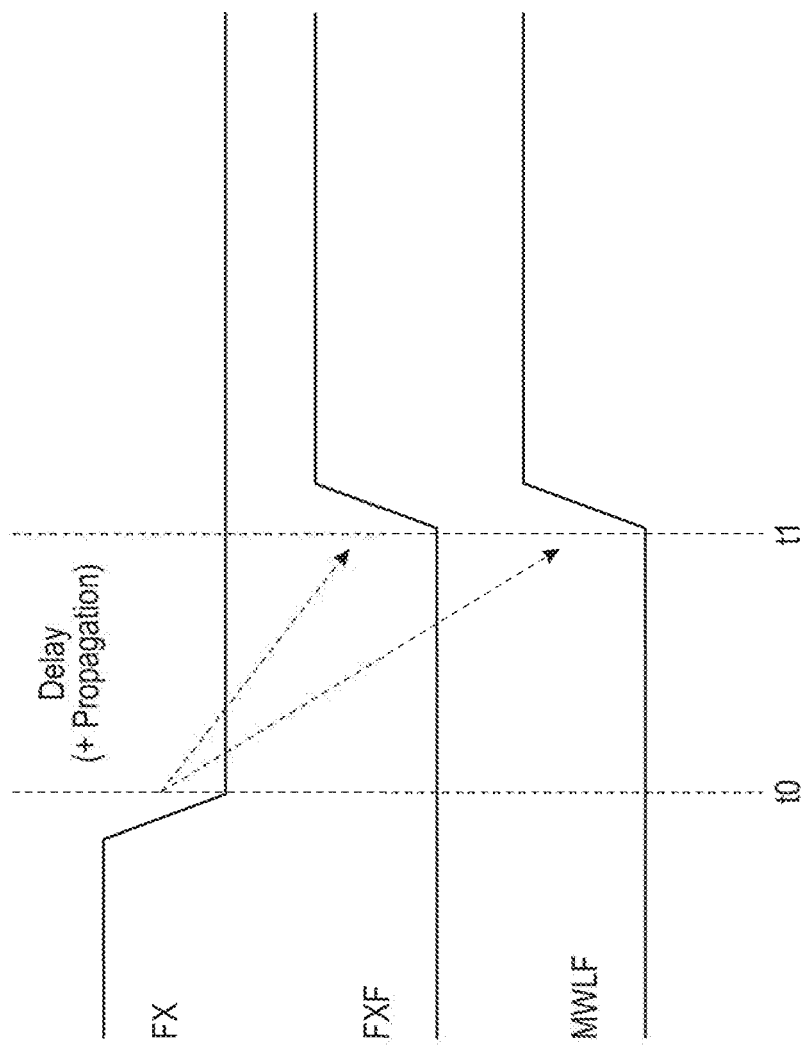
FIG. 6 is a timing diagram of command signals in a semiconductor memory device in accordance with embodiments of the disclosure.

FIG. 6 is a timing diagram of command signals in a semiconductor memory device in accordance with embodiments of the disclosure. FIG. 6 shows the operation of signals FX, FXF, and MWLF in the wordline driver circuit 500 of FIG. 5 during a wordline off operation. Although a specific pattern of signals corresponding to the circuit of FIG. 5 is shown, it is to be understood that other signals and signal patterns are possible based on other arrangements of the wordline driver circuit. In particular, while signals FXF and MWLF are shown operating together, in some embodiments they may operate independently of each other, and only one of the signals FXF or MWLF may change from a low level to a high level at time t1.

Before a first time t0, the signal FX is at a high logic level, while the signals FXF and MWLF are at a low logic level. Because the signal MWLF is at a low logic level, the signal FX is coupled to the wordline via the transistor MP1 of FIG. 5. Thus, the wordline is active (at a high voltage level). At the first time t0, the signal FX drops to a low logic level (a low voltage). At a second time t1 which is after t0, the signals FXF and MWLF rise from a low voltage to a high voltage. This may cause the transistors MN2 and MNN2 to activate, coupling the wordline to ground (and may cause transistor MP1 to deactivate, decoupling FX from the wordline).

Accordingly, before t0 the wordline may be at a high voltage, and after t1 the wordline may be coupled to a low voltage (e.g., ground). There may be a delay between t0 and t1. The delay between to and t1 may be due to a combination of a delay circuit (e.g., the delay circuit 326 of FIG. 3) and a propagation delay of the circuit. The delay between t0 and t1 may be dependent on temperature at least in part due to the operation of the delay circuit.

At time t0 the wordline voltage may drop to a low voltage due to still being coupled to the signal FX through transistor MP1 (since MWLF is still inactive). Thus, the wordline voltage may already be low by time t1 when the transistor MP1 is deactivated and the wordline is coupled to ground through transistors MN2 and/or MNN2. This may relieve stress on the transistors MN2 and MNN2 during the wordline off operation.

In some embodiments, the delay applied by the delay circuit (e.g., the delay circuit 326 of FIG. 3) may become longer when the temperature is relatively cold, and longer when the delay is relatively hot. Accordingly, the delay may be increased in response to a first temperature and decreased in response to a second temperature which is greater than the first temperature.

In some embodiments, the overall length of the delay between t0 and t1 may decrease at relatively colder temperatures due to large decrease in the propagation delay (e.g., due to decreased resistance at colder temperatures), however the delay provided by the delay circuit may increase, raising the ratio of the delays from the delay circuit and propagation delay.

In this manner, the timing between the wordline deactivation command (e.g., FX dropping to a low logic level) and the wordline being deactivated (e.g., coupled to ground) may be made dependent on temperature. Since the effects of hot carrier degradation may also be dependent on temperature, the reduced stress on the transistors MN2 and MNN2 from the delay between t0 and t1 may mitigate the effects of hot carrier degradation.

Figure 7:
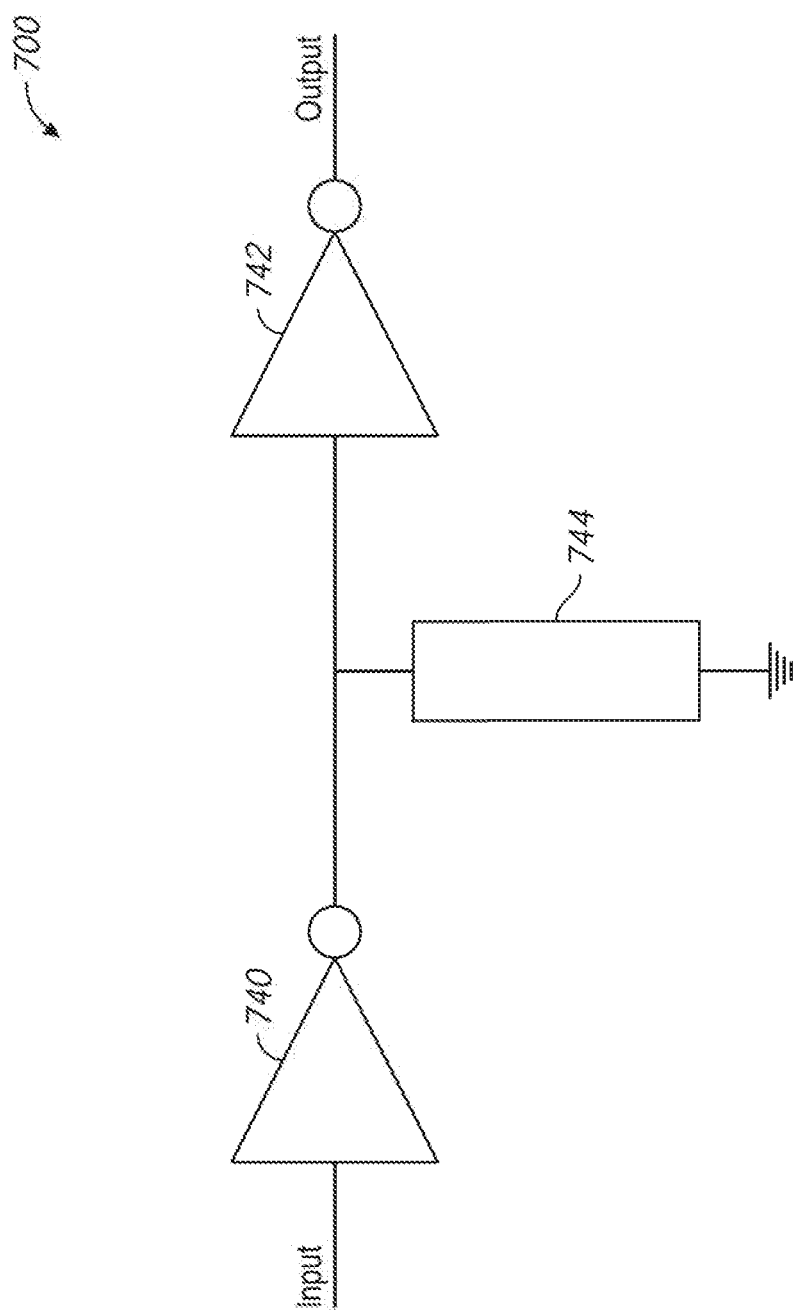
FIG. 7 is a schematic diagram of an analogue delay circuit in accordance with embodiments of the disclosure.

FIG. 7 is a schematic diagram of an analogue delay circuit in accordance with embodiments of the present disclosure. The delay circuit 700 may be used, in some embodiments, as the delay circuit 326 of FIG. 3. The delay circuit 700 accepts a signal along the line input and provides the signal along the line output after a delay. The delay circuit may include a first inverter circuit 740 and a second inverter circuit 742 coupled in series between the input and the output. The delay circuit 700 may also include an RC circuit 744, which is coupled to a point between the first inverter circuit 740 and the second inverter circuit 742.

Each of the inverters 740, 742 may receive a signal at a certain level and provide the signal at the logical inverse of that level. As an example, if the inverter circuit receives a signal at a logical high value (e.g., a high voltage, Vdd), it may provide an output at a logical low value (e.g., a ground voltage, Vss). Each of the inverter circuits may have a threshold voltage which, when the input voltage crosses triggers the inverter circuit to provide a signal at the opposite logical level. As an example, as a voltage rises along the input line, it may rise above a threshold voltage, at which point the first inverter circuit 740 may switch from providing a high voltage signal to providing a low voltage signal. Note that the threshold voltage for an increasing voltage input does not necessarily equal the threshold voltage for a falling voltage input.

The RC circuit 744 be coupled between the output of the first inverter circuit 740/the input of the second inverter circuit 742 and a voltage of the system. As shown, the RC circuit 744 is coupled to a ground voltage (e.g., Vss), however it is to be understood that the RC circuit could be coupled to any number of voltages such as, for example the power supply voltage Vdd. The RC circuit 744 may contribute to the delay of the delay circuit 700 by cause the output voltage of the first inverter circuit 740 to discharge (or charge) over time.

Since the RC circuit 744 causes the voltage along the coupling between the first and second inverter circuit 740, 742 to change over time, there may be a delay between when the signal along input changes to a new level and when the output of the first inverter circuit 740 reaches the threshold voltage of the second inverter circuit 742. There may thus be a delay between the signal arriving at the first inverter circuit 740 and being provided by the second inverter circuit 742.

The threshold voltage(s) of the second inverter circuit 742, as well as the RC circuit 744 may change based on the temperature of the delay circuit 700. In this manner the overall delay of the delay circuit 700 may depend on the temperature of the delay circuit. It should be noted that while the delay circuit 700 shows only a pair of inverters 740, 742 and a single RC circuit 744, the delay circuit 700 may include multiple elements, for example multiple of the RC circuits 700 may be coupled together in series.

Figure 8:
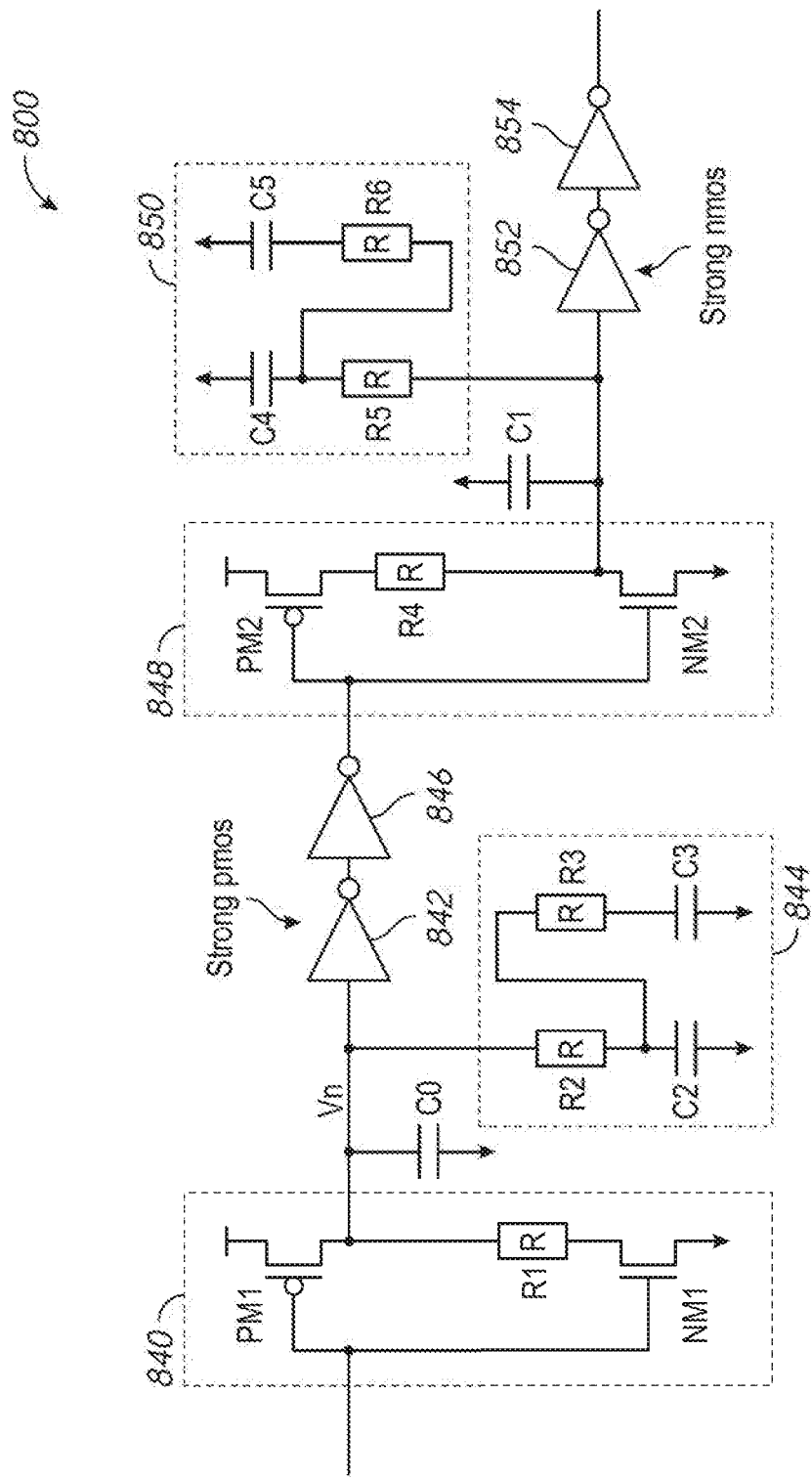
FIG. 8 is a schematic diagram of an analogue delay circuit in accordance with embodiments of the disclosure.

FIG. 8 is a delay circuit in accordance with embodiments of the disclosure. The delay circuit 800 may be an example implementation of the delay circuit 700 of FIG. 7. The delay circuit 800 may be an analogue delay circuit which is responsive to the temperature of components of the delay circuit 800 to increase or decrease the delay. The delay circuit 800 may include a first inverter circuit 840 coupled to an input of a second inverter circuit 842. An first RC delay circuit 844 may also be coupled to the input of the second inverter circuit 842 in parallel with the first inverter circuit 840. The second inverter circuit 842 may be coupled in series with a third inverter circuit 846. The third inverter circuit 846 may provide an input to the fourth inverter circuit 848. An output of the fourth inverter circuit 848 may be coupled to an input of a fifth inverter circuit 852. A second RC delay circuit 850 may also be coupled in parallel to the input of the fifth inverter circuit 852. The fifth inverter circuit is coupled in series with a sixth inverter circuit 854. The sixth inverter circuit 854 may provide the output of the delay circuit 800.

The first inverter circuit 840 may include a transistor PM1 and a transistor NM1. The transistor PM1 may be a PMOS type transistor while the transistor NM1 may be an NMOS type transistor. The gates of the transistor PM1, NM1 may be coupled in common to an input of the first inverter circuit 840. A source of the transistor PM1 is coupled to a power supply voltage (e.g., Vdd), while a drain of the transistor PM1 is coupled to a resistor R1. The source of transistor NM1 is coupled to ground, while the drain is coupled to the other side of the resistor R1. The output of the first inverter circuit 840 is coupled between the drain of the transistor PM1 and the resistor R1.

The output of the first inverter circuit 840 is coupled to the input of the second inverter circuit 842. The first RC delay circuit is also coupled to the input of the second inverter circuit 842 in parallel with first inverter circuit 840. A capacitor C0 is used to model a parasitic capacitance of the circuit and is coupled between the input of the second inverter 842 and a ground voltage. The capacitor C0 is coupled in parallel between the first inverter 840 and the first RC delay circuit 844.

The first RC delay circuit 844 may include resistors R2 and R3 and capacitors C2 and C3. The resistor R2 and the capacitor C2 are coupled in series between the input of the second inverter circuit 842 and a ground voltage. The resistor R3 and the capacitor C3 are coupled in series between ground and a node between resistor R2 and capacitor C2.

The second inverter 842 and the third inverter 846 may be physically similar to each other. The second inverter 842 may have a strong PMOS type transistor (e.g., the gate of the PMOS transistor may be wider than the PMOS transistor of the inverter 840 or 846) to allow a rapid transition to a high logical value. The strong PMOS transistor may provide a fast pull-up signal transition for the second inverter 842.

The output end of the third inverter 846 is provided to the fourth inverter 848. The fourth inverter 848 may be physically identical to the first inverter 840, except with transistors PM2 and NM2 instead of transistors PM1 and NM1, and resistor R4 instead of resistor R1. Unlike the first inverter 840, in the fourth inverter 848, the output is coupled between the resistor R4 and the transistor NM2.

Similar to the coupling between the first inverter 840 and the second inverter 842, the fourth inverter circuit 848 and the second RC delay circuit 850 are both coupled in parallel to the input of the fifth inverter circuit 852. A capacitor C1 is shown coupled between a power supply voltage (e.g., Vdd) and a point between the fourth inverter circuit 848 and the second RC delay circuit 850. The capacitor C1, similar to the capacitor C0, may model a parasitic capacitance of the circuit, rather than a component deliberately added to the circuit. The second RC delay circuit 850 may be similar to the first RC delay circuit 844. The second RC delay circuit 850 includes a resistor R5 and capacitor C4 coupled in series to a power supply voltage Vdd. A resistor R6 and capacitor C5 are coupled in series between the power supply voltage Vdd and a point between the resistor R5 and the capacitor C4.

The fifth inverter 852 and the sixth inverter 854 may be physically similar to each other. The fifth inverter 852 may have a strong NMOS type (e.g., the gate of the NMOS transistor may be wider than the NMOS transistor of the inverter 848 or 854) to allow a rapid transition to a low logical value. The strong NMOS transistor may provide a fast pull down signal transition for the fifth inverter 852.

In some embodiments, the second, third, fifth, and sixth inverters 842, 846, 852, and 854 may generally have a similar structure to the first and fourth inverters 840 and 848, except the inverters may not include a resistive component between one of the respective transistors and the output node. The inverter 840 includes the resistor R1 between the PMOS transistor PM1 and the output node coupled to the inverter 842. Similarly, the inverter 848 includes the resistor R4 between the NMOS transistor NM2 and the output node coupled to the inverter 852. The resistors R1 and R4 may act as voltage dividers that serve to add additional transition delay to the inverters 840 and 848, respectively. Since only the first and fourth inverters 840, 848 are shown in detail, operation of the inverter circuit will only be described with regards to those two inverter circuits. However it is to be understood that, in some embodiments, the other inverter circuits may function in a similar manner.

The first inverter circuit 840 accepts and input voltage which may be either a logical high (e.g., power supply voltage Vdd) or a logical low (e.g., ground). When the input is a logical low, the transistor PM1 is active while the transistor NM1 is inactive. Accordingly, a power supply voltage (e.g., Vdd) is coupled to the output of the inverter and to the resistor R1. Thus, when the input is low, the output may transition high, with a slight delay because of the resistor R1. When the input is high, the transistor PM1 is inactive while the transistor NM1 is inactive. Accordingly, the output is coupled to ground through the resistor R1. The fourth inverter circuit 848 may work in a similar manner, except that the when the input is low the power supply voltage is coupled to the output through resistor R4 (e.g., which may delay the transition to a low logical value), while when the input is high the output is coupled to ground without an intervening resistor.

In some embodiments the capacitors C2, C3, C4, and C5 may all have an equal capacitance. In some embodiments the resistors R1, R2, R3, R4, R5, and R6 may all have an equal capacitance. In other embodiments, the resistors and capacitors may have unequal values. The values of the resistors and the capacitors may be selected based on a desired length of delay and/or temperature response of the delay circuit 800. The respective resistive values of the resistors R1-R6 and the capacitive values of the capacitors C2-C5 may be selected to provide a particular resistive-capacitive (RC) delay to transitions received at inputs of the inverters 842 and 852, respectively.

Figure 9:
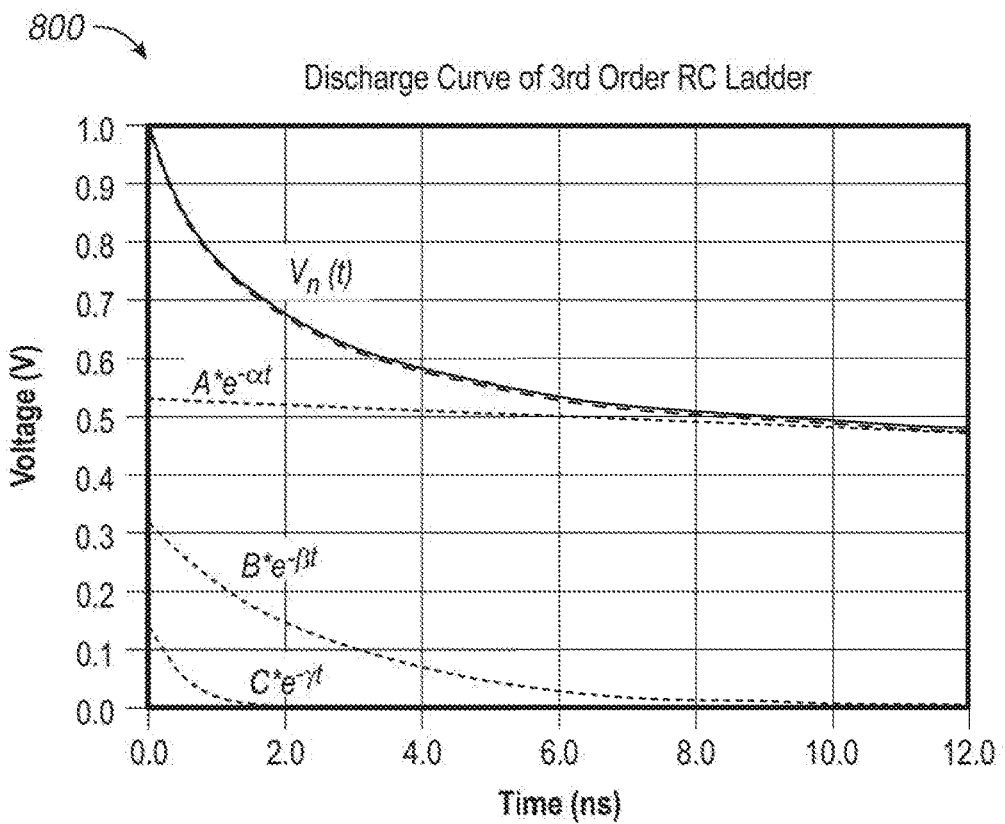
FIGS. 9 and 10 are graphs depicting characteristics of the delay circuit of FIG. 7 in accordance with embodiments of the disclosure.
Figure 10:
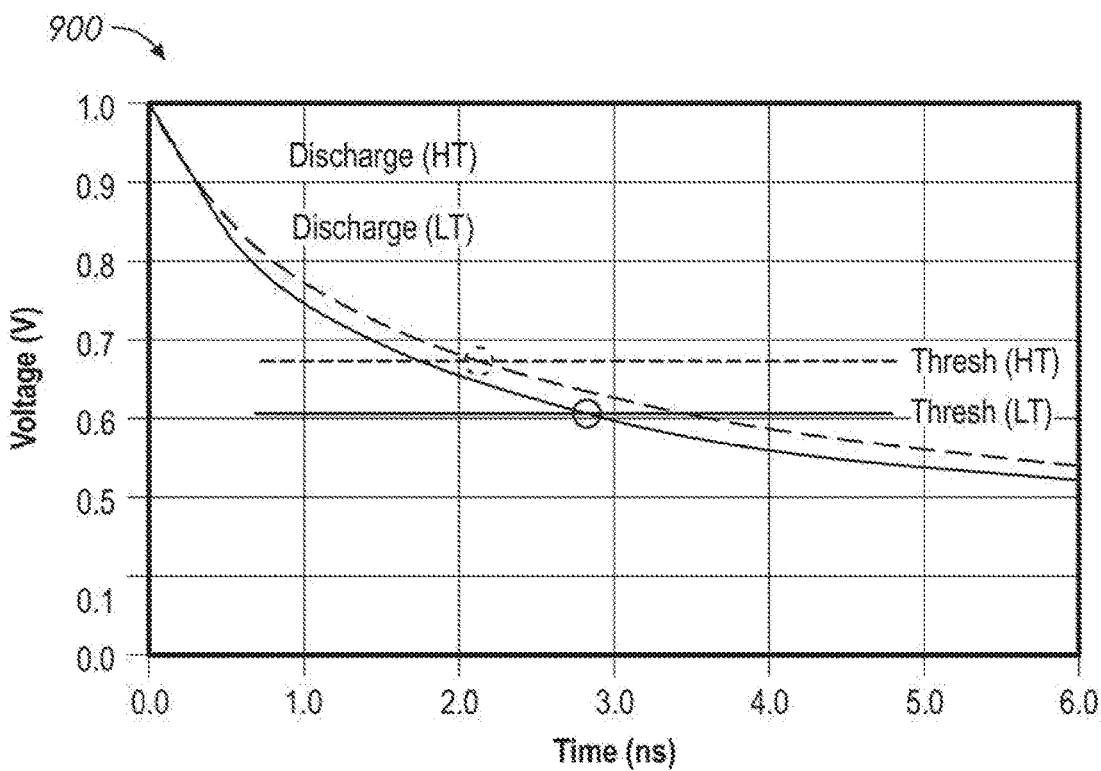

FIGS. 9 and 10 are graphs depicting characteristics of the delay circuit 800 of FIG. 8 in accordance with embodiments of the disclosure. The operation of the delay circuit 800 may be modeled by calculating the voltage through the circuit. As an example, the voltage Vn, which is the voltage along the input of the second inverter 842 is calculated and plotted in graphs 900 and 1000 of FIGS. 9 and 10, respectively. Although not shown here for brevity, the voltage of the input of the fourth inverter 852 may charge in a manner similar to the discharge of Vn represented in graphs 900 and 1000. In both graphs 900 and 1000, the x-axis represents time and is expressed in units of nanoseconds (ns) while the y-axis represents voltage and is expressed in units of volts (V). Although specific operation of a specific circuit is shown, it is to be understood that other embodiments may have different waveforms. For example, other circuits may operate at different times and/or different voltages, which may be varied by, for example, changing the values of the resistors in the circuit 800.

FIG. 9 shows a graph 900 of the discharge of voltage Vn over time. The discharge may be modeled by equation 1, below:

$$V_n(t) = (Ae^{-\alpha t} + Be^{-\beta t} + Ce^{-\gamma t}) * Vdd \qquad \text{Eqn. 1}$$

A, B, C, α, β, and γ may each be constants of the equation, while t may represent time. The term Vdd may be the power supply voltage of the system. The graph 900 may represent a scenario where the power supply voltage Vdd is 1 volt. The constants A, B, C, α, β, and γ may be determined, for example, by solving a laplace transform and a third order equation with resistance and capacitance values.

The graph 900 shows the voltage Vn plotted as a function of time, along with plots of the terms of Equation 1, $Ae^{-\alpha t}$, $Be^{-\beta t}$, and $Ce^{-\gamma t}$, each plotted separately. As may be seen at 0 seconds when the circuit begins to discharge, the voltage Vn begins at 1 volt (e.g., Vdd). Over time, the voltage decays as the voltage Vn is discharged through the first RC delay circuit 844 of FIG. 7. At time t=0 ns, the delay circuit may switch from receiving a signal at a low level (e.g., at 0V) to receiving a signal at a high level (e.g., at 1 V). This may cause the first inverter to output a low voltage, which in turn may allow the voltage Vn to begin discharging through the first RC circuit 844.

The graph 1000 shows how temperature may change the discharge response. The graph 1000 shows Vn plotted as a function of time for a circuit which is at a relatively high temperature and for a circuit which is at a relatively low temperature. Additionally plotted are threshold voltages for the circuit at the high temperature and the low temperature. The threshold voltages may represent a voltage level at which the coupled second inverter circuit 848 is triggered (e.g., switches from providing a low voltage to providing a high voltage as an output in response to the falling input voltage of Vn). Because the second inverter circuit may also be affected by temperature, the threshold voltages for the high temperature condition Thresh(HT) and the threshold voltage for the low temperature condition Thresh(LT) are not equal.

As may be seen from the graph 1000, the time at which the voltage Vn falls to the threshold voltage varies with temperature. In particular, in the high temperature condition the voltage Vn discharges to the threshold temperature Thresh(HT) at just after 2 ns, while under the low temperature condition the voltage Vn discharges to the threshold temperature Thresh(LT) just before 3 ns. In this manner, the delay circuit 800 may take longer to provide a response (e.g., increase the delay) under relatively colder temperatures.

The remaining components of the delay circuit 800 of FIG. 8 may respond to the changing voltage of Vn. In particular, the input voltage of the fifth inverter circuit 848 may charge through the second RC delay circuit 850 in a manner similar to the discharge of Vn described in graphs 900 and 1000. Because there are an even number of inverter circuits, the overall output of the delay circuit 800 may have the same level as the signal input to the delay circuit 800. However, as shown in graph 1000, the inverters may not 'flip' (e.g., switch the level they are providing as an output in response to a changing input) until some amount of time has passed. The time that passes may be dependent on the temperature of the delay circuit 800. In this manner, the delay circuit 800 may delay a signal by a delay time that is inversely proportional to the temperature of the circuit.

Figure 11:
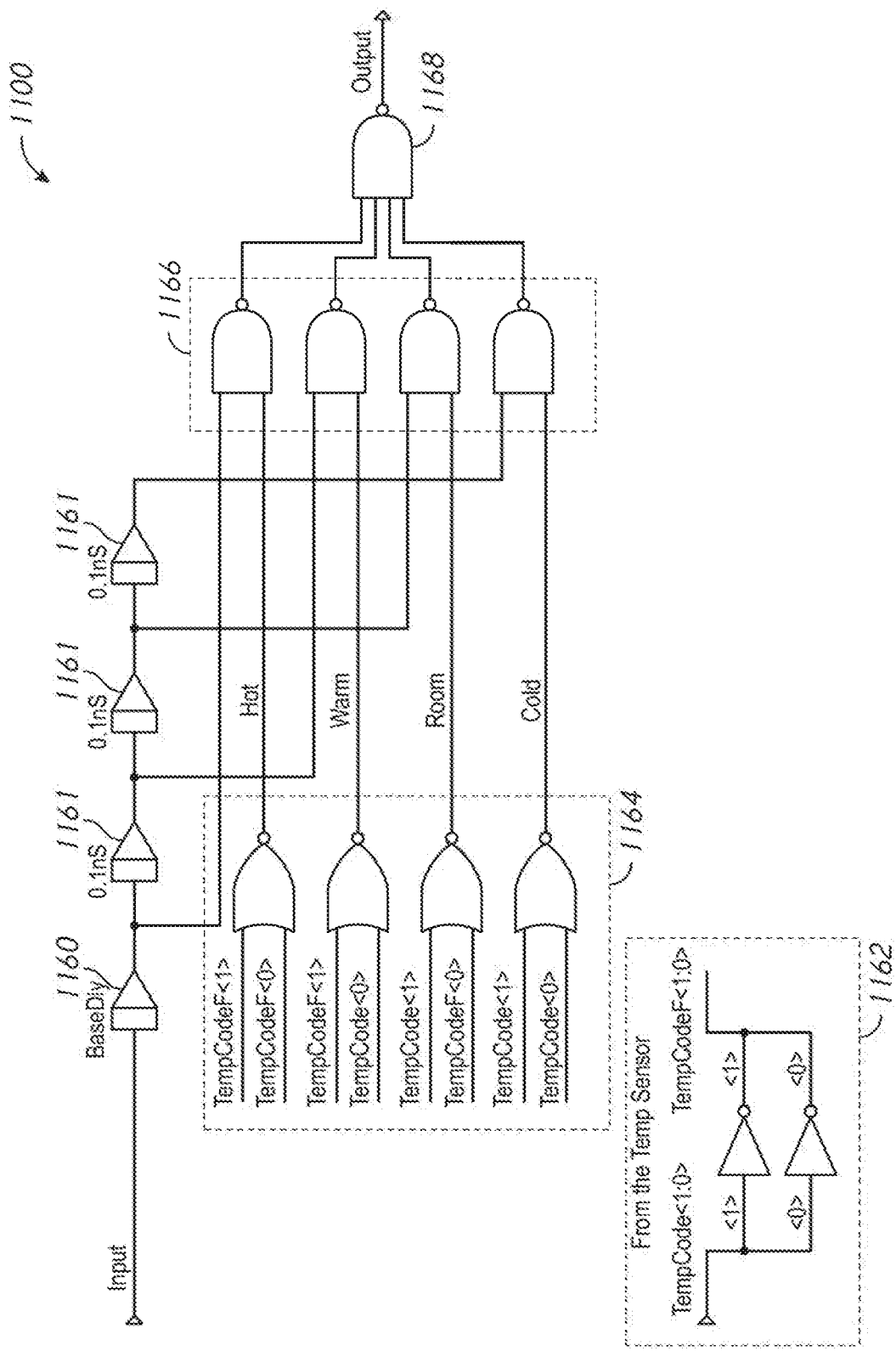
FIG. 11 is a schematic diagram of a digital delay circuit in accordance with embodiments of the present disclosure.

FIG. 11 is a schematic diagram of a digital delay circuit in accordance with embodiments of the present disclosure. The delay circuit 1100 may be used as the delay circuit 326 of FIG. 3 in some embodiments. The delay circuit 1100 accepts a temperature signal TempCode from a coupled temperature sensor (e.g., the temperature sensor 327 of FIG. 3). The temperature signal TempCode may be expressed as a binary code which has some number of discrete values. As shown the TempCode is a 2-bit code with 4 possible values. The delay circuit 1100 may accept an input and provide it as an output after a delay, which may be increased by an incremental value as the TempCode indicates a lower temperature. Although the delay circuit 1100 is shown as having certain delay timings, and responsive to a certain number of temperature levels, it should be understood that these may be altered. For example, while the circuit 1100 is shown as responsive to 4 different temperature conditions, in some embodiments it may be responsive to 2, 8, or other numbers of temperature values.

The delay circuit 1100 includes a base delay circuit 1160, incremental delay circuits 1161, inverter circuits 1162, NOR gates 1164, NAND gates 1166, and NAND gate 1168. The temperature code TempCode may be a 2-bit code that consists of two values TempCode<1> and TempCode<0>. The inverter circuits 1162 may be used to generate an inverse temperature code TempCodeF by taking an inverse of each of the values to generate TempCodeF<1> and TempCodeF<0> respectively. A series of NOR gates 1164 are coupled to TempCode and TempCodeF. Since a 2-bit code may have 4 values, 4 NOR gates 1164 are provided. In other example circuits with more (or less) bits in the TempCode, more (or less) NOR gates 1164 may be provided.

A first NOR gate may receive TempCode<1> and TempCode<0> as inputs, and may provide an output 'cold' at a high logic level when both inputs are at a low logic level (e.g., when the temperature sensor is indicating the lowest expressible temperature). A second NOR gate may receive TempCode<1> and TempCodeF<0> as inputs and may provide an output 'room' at a high logic level when both inputs are at a low logic level (e.g., when TempCode<1>=0 and TempCode<0>=1). A third NOR gate may receive TempCodeF<1> and TempCode<0> as inputs and may provide an output 'warm' at a high logic level when both inputs are at a low logic level (e.g., when TempCode<1>=1 and TempCode<0>=0). A fourth NOR gate may receive TempCodeF<1> and TempCodeF<0> as inputs, and may provide an output 'hot' at a high logic level when both inputs are at a low logic level (e.g., when the original TempCode was at the highest expressible temperature).

An input signal is provided to base delay circuit 1160. The base delay circuit 1160 may provide the input signal as an output after a set period of delay (referred to herein as a base delay). The output of the base delay circuit 1160 may be coupled to the incremental delay circuits 1161 in series. Each of the incremental delay circuits 1161 may add a set amount of delay between the time an input signal is received and the time the incremental delay circuit 1161 provides the signal as an output. In the example of FIG. 10, the incremental delay circuits 1161 may each add 0.1 ns of delay.

The NAND gates 1166 may be used to output a delayed signal in response to the temperature level. Each of the NAND gates 1166 has a first input terminal coupled to one of the signals cold, room, warm, or hot provided by the NOR gates 1164. The second terminal of the NAND gates 1166 is coupled along the delay path of the base delay circuit 1160 and incremental delay circuits 1161. The first NAND gate 1166 accepts the signal cold and is coupled to an output of the third incremental delay circuit. It provides a low logic level output when both the cold signal and the output of the final incremental delay circuit 1161 is at a high logic level. The second NAND gate 1166 receives the signal room and the output of the second incremental delay circuit 1161. It proves a low logic level output when both the room signal and the output of the second incremental delay circuit 1161 is at a high logic level. The third NAND gate 1166 receives the signal warm and the output of the first incremental delay circuit 1161. It proves a low logic level output when both the warm signal and the output of the first incremental delay circuit 1161 is at a high logic level. The second NAND gate 1166 receives the signal room and the output of the second incremental delay circuit 1161. It proves a low logic level output when both the room signal and the output of the second incremental delay circuit 1161 is at a high logic level. The fourth NAND gate 1166 receives the signal hot and the output of the base delay circuit 1160. It proves a low logic level output when both the hot signal and the output of the base delay circuit 1161 is at a high logic level.

The outputs of each of the NAND gates 1166 may be provided to a NAND gate 168 as inputs. The NAND gate 1168 may provide a low logic level output when all of the inputs are at a high logic level, and provide a high logic level otherwise. The output of the NAND gate 1168 may be the output of the delay circuit 1100.

For purposes of describing operation of the delay circuit 1100 an example scenario will be considered where the TempCode is indicating that it is 'warm' (e.g., the TempCode is 1,0) and where a signal is received along the input. Because the temp code indicates that it is warm, the signal 'warm' will be at a high logic level. The received signal will be delayed by the base delay circuit 1160, and then delayed again by the first incremental delay circuit 1161. This will cause both inputs of the third NAND gate 1166 to become positive, which will cause the third NAND gate 1166 to provide a low logic level signal to one of the inputs of the NAND gate 1168. This causes the NAND gate 1168 to shift to providing a high output signal (since not every input of the NAND gate 1168 is at a low logic level). Thus, when the TempCode indicates a 'warm' temperature, the signal along input is delayed by the delay amount of the base delay circuit 1160 plus the delay amount of one incremental delay circuit 1161. In a similar manner, the delay circuit 1100 may function such that at each of the four expressible values of TempCode, the signal is delayed by the base delay plus 0, 1, or 2 times the incremental delay, with colder temperatures triggering longer delays.

Figure 12:
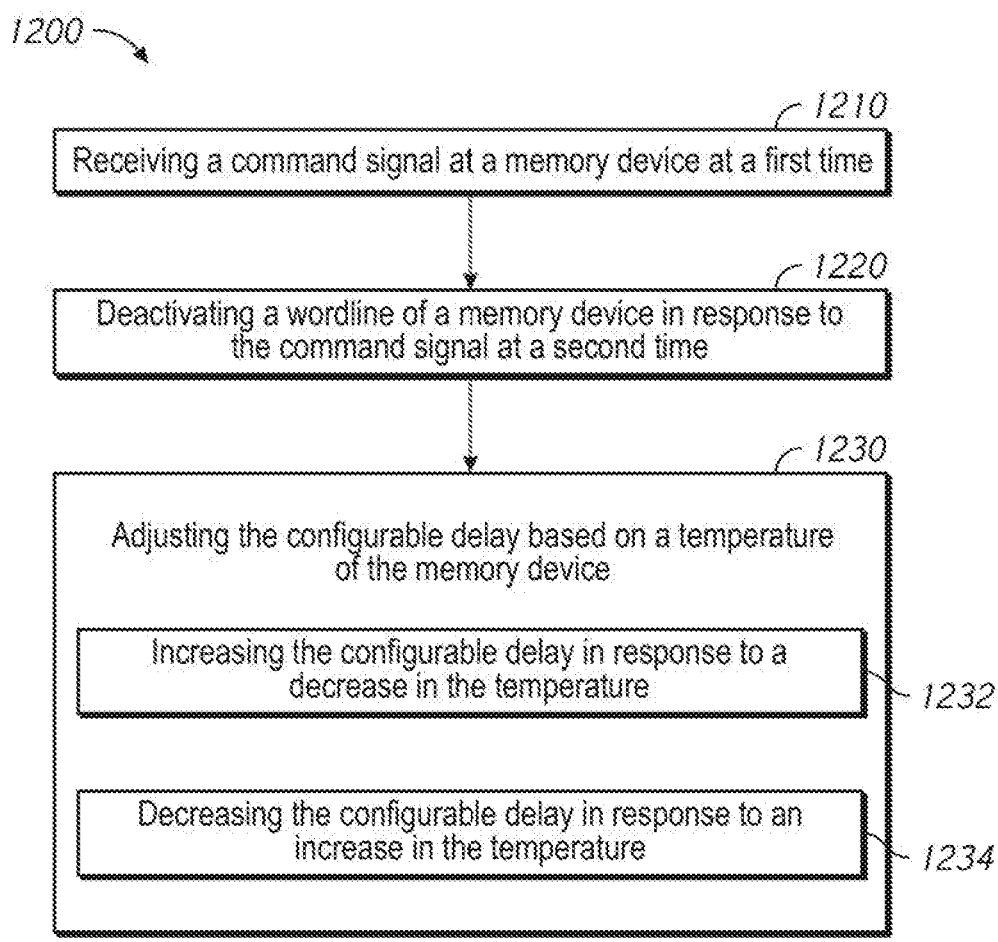
FIG. 12 is a flow chart depicting a method of delaying command signals in accordance with embodiments of the disclosure.

FIG. 12 is a flow chart depicting a method of a method of delaying command signals in accordance with embodiments of the disclosure. The method 1200 may include block 1210, which describes receiving a command signal at a memory device at a first time. The command signal may be provided by an external component of the memory device, such as a memory controller. The command signal may be generated by an internal component of the memory device and provided to one or more other components of the memory device. The command signal may indicate a wordline deactivation, and may, in some examples, be a precharge signal.

The method continues with block 1220, which describes deactivation a wordline of the memory device in response to the command signal at a second time. There may be a delay between the first time and the second time. The delay may be caused, at least in part, by the combination of inherent system delays (e.g., propagation delays) and a configurable delay. The configurable delay may be provided by a delay circuit, which may be inserted along a signal path of the command signal.

The method continues with block 1230, which describes adjusting the configurable delay based on a temperature of the memory device. In some embodiments, the temperature may be determined by a temperature sensor positioned about the memory device. In some embodiments the delay circuit may be responsive to the temperature of the delay circuit. As described in block 1232, the configurable delay may adjusted by increasing the configurable delay in response to a decrease in the temperature or, as described in block 1234 by decreasing the configurable delay in response to an increase in the temperature.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a memory cell array; and
a delay circuit coupled to the memory array, wherein the delay circuit receives a command signal and provides it to the memory array after a delay time, wherein the delay time has a length which is responsive to a temperature, and wherein the delay circuit is configured to increase the delay time in response to a first temperature and decrease the delay in response to a second temperature that is greater than the first temperature, and wherein the command signal is a pre-charge signal.

2. The apparatus of claim 1, further comprising a temperature sensor coupled to the memory array and configured to output a signal proportional to a temperature of the memory array.

3. The apparatus of claim 2, wherein the delay circuit is a programmable delay circuit coupled to the temperature sensor and responsive to the signal from the temperature sensor.

4. The apparatus of claim 1, wherein the delay circuit comprises an analogue circuit responsive to a temperature of the delay circuit.

5. The apparatus of claim 4, wherein the analogue circuit comprises a plurality of inverters and at least one RC delay circuit coupled between the plurality of inverters.

6. The apparatus of claim 5, wherein one of the plurality of inverters comprises provides a fast pull-up signal transition, and another of the plurality of inverters provides a fast pull down signal transition.

7. The apparatus of claim 1, wherein the memory cell array comprises a plurality of wordlines, each of the wordlines coupled to a respective wordline driver circuit, wherein at least one of the respective wordline driver circuits is configured to receive the command signal.

8. The apparatus of claim 7, wherein the wordline driver circuit is configured to reduce the voltage of the wordline in response to receipt of a first signal, and further configured to couple the wordline to a ground voltage in response to receipt of the command signal after the delay time, wherein the first signal is received before the command signal.

9. A method comprising:
receiving a command signal at a memory device at a first time;
deactivating a wordline of the memory device in response to the command signal at a second time, wherein a time between the first time and the second time is based, at least in part, on a propagation delay and a configurable delay generated by a delay circuit; and
adjusting the configurable delay based on a temperature of the memory device, wherein a length of the configurable delay is responsive to the temperature, and wherein the adjusting comprises:
increasing the configurable delay in response to a decrease in the temperature; and
decreasing the configurable delay in response to an increase in the temperature.

10. The method of claim 9, wherein the proportion of the configurable delay to the propagation delay is increased in response to the decrease in the temperature, and wherein the proportion of the configurable delay to the propagation delay is decreased in response to the increase in the temperature.

11. The method of claim 9, further comprising decreasing the time between the first time and the second time in response to the decrease in temperature.

12. The method of claim 9, further comprising:
measuring the temperature of the memory device based on an input from a temperature sensor; and
providing the measured temperature to the delay circuit, wherein the delay circuit generates the configurable delay in response to the measured temperature.

13. The method of claim 9 further comprising reducing stress on a wordline driver circuit based on the delay between the first time and the second time.

* * * * *